United States Patent [19]

Parker et al.

[11] Patent Number: 5,144,520
[45] Date of Patent: Sep. 1, 1992

[54] POWER SOLENOID DRIVE CIRCUIT WITH SWITCH BOUNCE REJECTION

[75] Inventors: Edward I. Parker, Holden; Harold Weiss, Marlboro, both of Mass.

[73] Assignee: Stanley-Parker, Inc., Worcester, Mass.

[21] Appl. No.: 740,883

[22] Filed: Aug. 5, 1991

Related U.S. Application Data

[63] Continuation-in-part of Ser. No. 451,862, Dec. 18, 1989, abandoned, and Ser. No. 325,438, Mar. 20, 1989, abandoned, which is a continuation-in-part of Ser. No. 228,291, Aug. 4, 1988, abandoned.

[51] Int. Cl.$^5$ ............................................. H01H 47/00
[52] U.S. Cl. ..................................... 361/153; 361/185; 307/247.1; 307/268; 307/542.1
[58] Field of Search ................... 361/3, 143, 152, 153, 361/160, 170, 185, 186, 205; 307/243, 247, 247.1, 261, 273, 643, 647, 648; 323/322, 323; 219/10.55 B

[56] References Cited

U.S. PATENT DOCUMENTS

| | | | |
|---|---|---|---|
| 4,041,267 | 8/1977 | Wechler | 219/10.55 B |
| 4,153,922 | 5/1979 | Azuma et al. | 361/3 |
| 4,333,019 | 6/1982 | Weigart | 307/643 |
| 4,360,855 | 11/1982 | Ohba | 361/153 |
| 4,490,771 | 12/1984 | Huber et al. | 361/154 |
| 4,492,880 | 1/1985 | Weiss | 307/643 |
| 4,543,493 | 9/1985 | Stanley et al. | 361/205 |
| 4,578,734 | 3/1986 | Delbosse | 361/153 |
| 4,631,627 | 12/1986 | Morgan | 361/153 |
| 4,713,564 | 12/1987 | Kimball et al. | 307/247.1 |

Primary Examiner—Jeffrey A. Gaffin
Attorney, Agent, or Firm—Samuels, Gauthier & Stevens

[57] ABSTRACT

A driver circuit that is responsive to an input AC voltage provides a variable drive signal to a load circuit, such as, a solenoid coil, for each actuation of a switch. A sine wave shaper produces a positive edge variably delayed square wave timing signal for a continuously clocked flip-flop. In response to the switch actuation, the clocked flip-flop generates a control signal for a selected period of time that is related to one cycle of the AC input voltage. The selected period of time occurs only during the positive portion of the input AC voltage cycle. The control signal is employed to generate the drive signal for the load circuit. The driver circuit provides switch bounce rejection equal to one cycle of the AC input voltage.

19 Claims, 4 Drawing Sheets

POWER SOLENOID DRIVE CIRCUIT WITH SWITCH BOUNCE REJECTION

CROSS-REFERENCE TO RELATED APPLICATION

This application is a continuation-in-part application of both Ser. No. 451,862 filed Dec. 18, 1989, by Edward I. Parker for Variable Power Solenoid Drive Circuit now abandoned, and Ser. No. 325,438 filed Mar. 20, 1989, now abandoned, which is a continuation-in-part application of Ser. No. 228,291, filed Aug. 4, 1988, by Harold Weiss and Edward I. Parker for Solenoid Drive Circuit now abandoned. The present application and application Ser. Nos. 451,862, 325,438 and 288,291 are owned by a common assignee.

BACKGROUND OF THE INVENTION

The present invention relates to drive circuits in general and, more particularly, to a drive circuit that is responsive to an input AC voltage for providing a switch actuated drive signal to a load circuit such as, a solenoid coil without the deleterious effect of switch contact bounce.

Various drive circuits for actuating electrically operated stapling devices have been disclosed in the art. For example, U.S. Pat. No. 4,333,019 and 4,492,880 disclose such circuits. Drive circuits for electric staplers and the like should provide a high degree of immunity from false actuations that can be produced by noise and other pulses in the AC line voltage. In addition, such drive circuits should prevent accidental firings that may result from switch bounce and other artifacts.

It is accordingly a general object of the present invention to provide an improved driver circuit.

It is a specific object of the invention to provide an improved driver circuit for use with an electric stapler.

It is a further object of the invention to provide a driver circuit that is responsive to an input AC voltage to generate a variable power drive signal for a load circuit, such as, a solenoid coil in response to the actuation of a switch.

It is another object of the invention to provide a variable power driver circuit that is independent of the frequency of the input AC voltage.

It is still another object of the invention to provide a driver circuit that provides switch bounce rejection for one full cycle of the input AC voltage.

It is still another object of the invention to provide an easily adjustable variable power driver circuit for a solenoid coil.

CROSS-REFERENCE TO RELATED APPLICATION

This application is a continuation-in-part application of both Ser. No. 451,862 filed Dec. 18, 1989 by Edward I. Parker for Variable Power Solenoid Drive Circuit now abandoned, and Ser. No. 325,438 filed Mar. 20, 1989, now abandoned which is a continuation-in-part application of Ser. No. 228,291, filed Aug. 4, 1988 by Harold Weiss and Edward I. Parker for Solenoid Drive Circuit now abandoned. The present application and application Ser. Nos. 451,862, 325,438 and 228,291 are owned by a common assignee.

SUMMARY OF THE INVENTION

The driver circuit of the present invention is responsive to an input AC voltage to provide a variable power drive signal to a load circuit, such as, a solenoid coil for each actuation of a switch. The input AC voltage sine wave is shaped to produce a positive edge variably delayed square wave timing signal. The timing signal is applied to a continuously clocked flip-flop which generates a control signal for a selected period of time upon actuation. The control signal is related to one cycle of the AC input voltage. The selected period of time occurs only during the positive portion of the input AC voltage cycle. The control signal from the continuously clocked flip-flop is employed to actuate firing circuit that supplies the actual drive signal to the load circuit.

BRIEF DESCRIPTION OF THE DRAWINGS

The above objects and other objects and features and advantages of the present invention will become apparent from a detailed description of a preferred embodiment of the invention, selected for purposes of illustration and shown in the accompanying drawings, in which.

DETAILED DESCRIPTION OF THE PREFERRED EMBODIMENT

Figure 3:
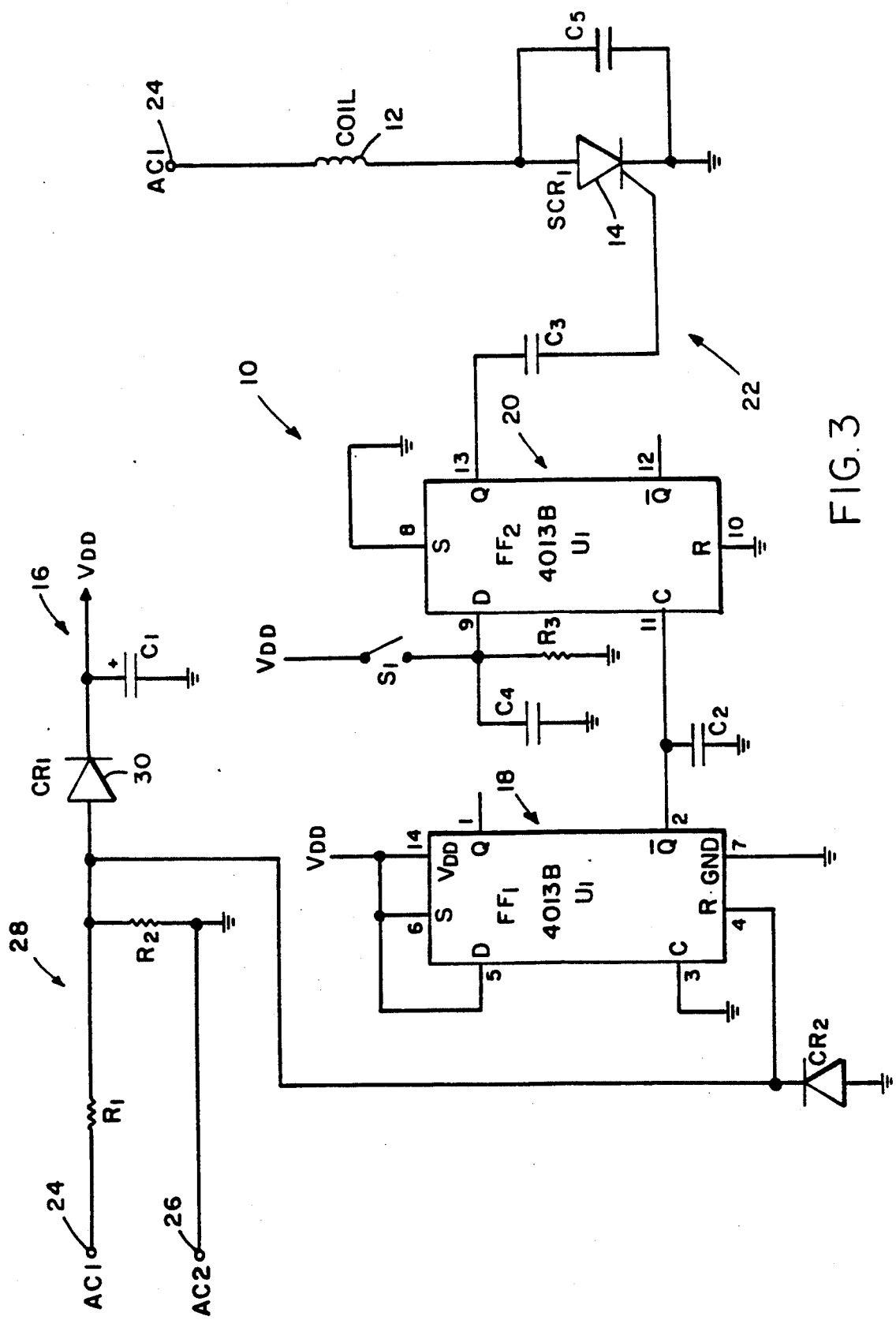
FIG. 3 is a schematic diagram of the driver circuit of the present invention.
Figure 4:
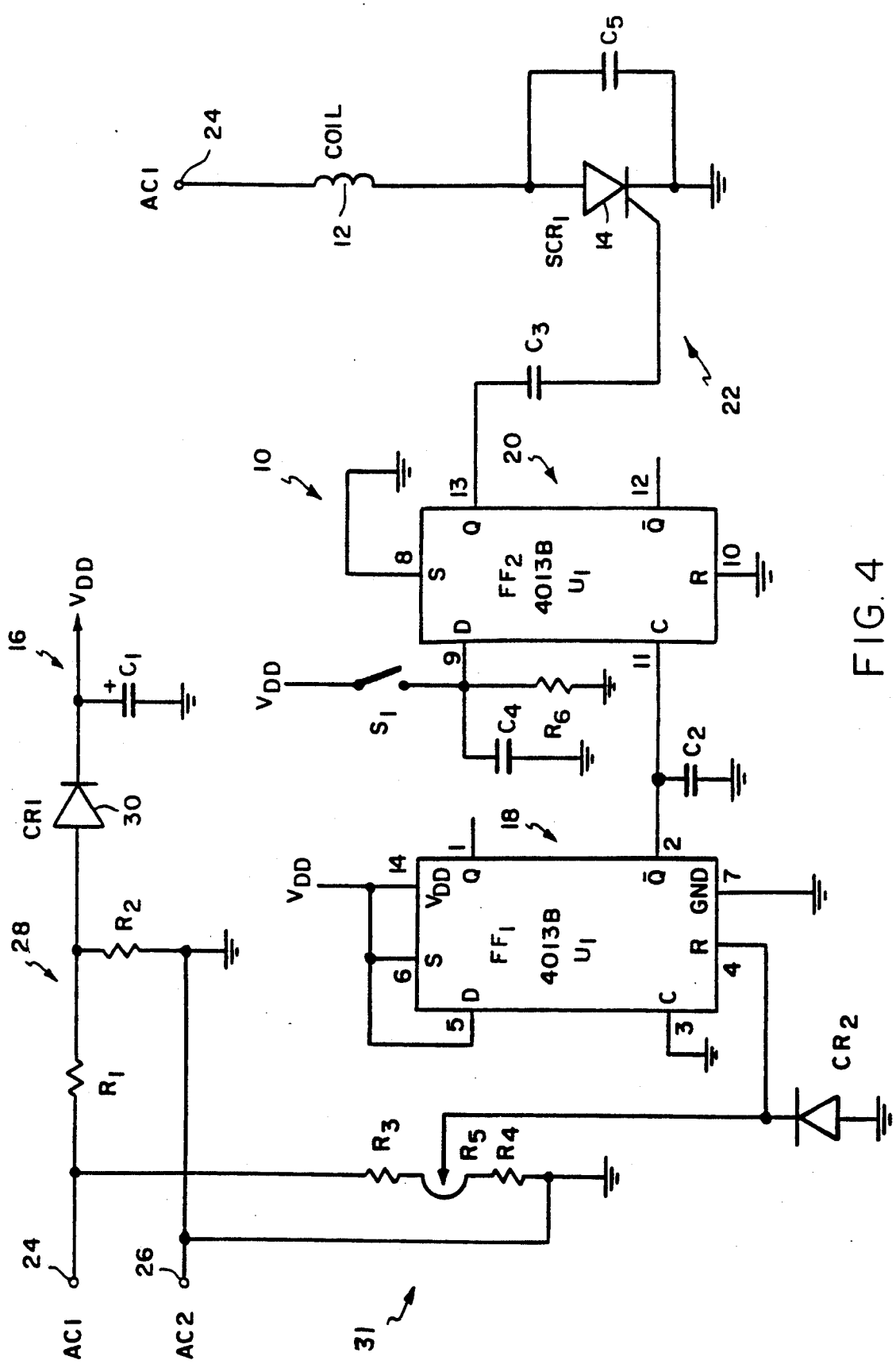
FIG. 4 is a schematic diagram of the variable power driver circuit of the present invention.

Referring now the drawings and particularly to the schematic of FIGS. 3 and 4, there is shown a power driver circuit and a variable power driver circuit, respectively, of the present invention indicated generally by the reference numeral 10 for providing a power drive signal (variable in FIG. 4) to a load circuit 12, such as, the coil of an electric stapler.

The solenoid driver circuit 10 is capable of triggering an SCR 14 for a single half-cycle of the AC line. The circuit comprises a power supply section 16, a sine wave shaper 18, a clocked flip-flop 20, an SCR coupling 22 and the SCR 14.

The power supply section is used to generate $V_{DD}$ (drain voltage) for dual D flip-flop, $FF_1$ and $FF_2$, such as CMOS 4013B. A source of input AC voltage (not shown) is applied to driver circuit input terminals 24 and 26. The power supply comprises a voltage divider 28 and a half-wave rectifier 30. The voltage divider 28 uses resistors $R_1$ and $R_2$. The rectifier circuit with a filter capacitor $C_1$ generates an output of 12 volts DC with a ripple of $+/-2$ volts at nominal AC line input (115 volts).

The sine wave shaper 18 is used to decrease the rise and fall time of the AC input waveform in order to insure a fast transition through the switching region of the clocked flip-flop. The first stage ($FF_1$) of the dual flip-flop is used for this purpose. The AC input voltage, which is passed through the voltage divider 28 in FIG. 3 and through a variable voltage divider 31 in FIG. 4 is used as the input to the wave shaper 18. The voltage divider 31 of FIG. 4 comprises fixed resistors $R_3$ and $R_4$ and a potentiometer $R_5$. Diode $CR_2$ is used to prevent the AC voltage from going negative and causing damage to the flip-flop $FF_1$. Resistor $R_4$ of FIG. 4 prevents the voltage from going below the switching point of the flip-flop $FF_1$ and causing a "no fire" of the circuit.

The flip-flop $FF_1$ has its clock input disabled and is used as an R-S flip-flop. Since the S input is connected to $V_{DD}$, the output Q/ will be low as long as R is kept low. When R is forced high (during the positive portion of the AC input), the Q/ output will be forced high (the Q/ output will also be high since the S input is held high). The output Q/ will therefore follow the AC input except for the positive edge variable delay described below.

Figure 1A:
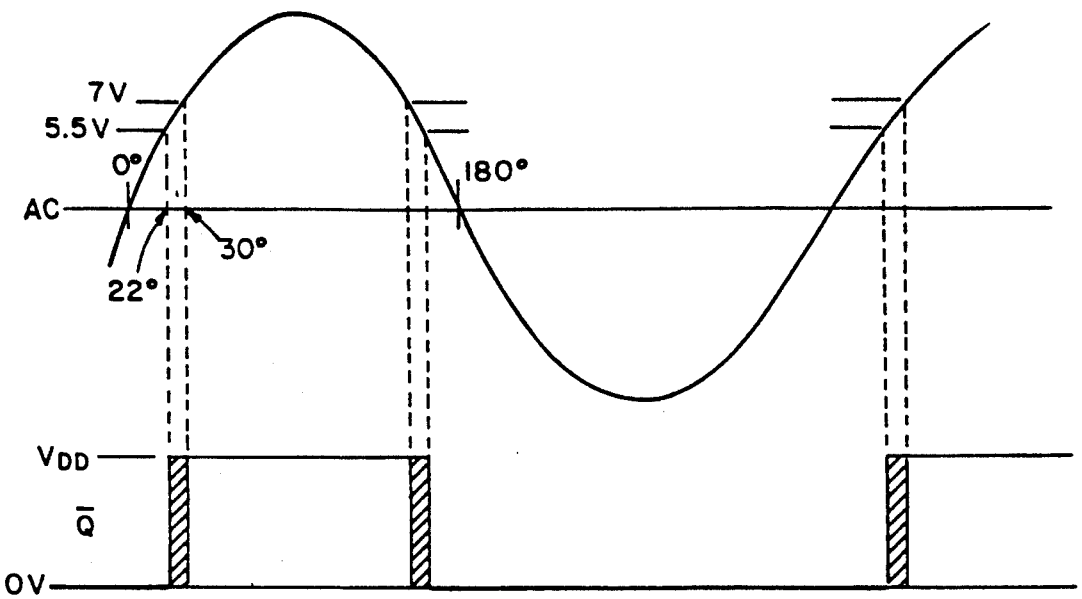
FIGS. 1A and 1B are wave form diagrams showing the AC input voltage wave plotted against the Q/output of the first flip-flop.
Figure 1B:
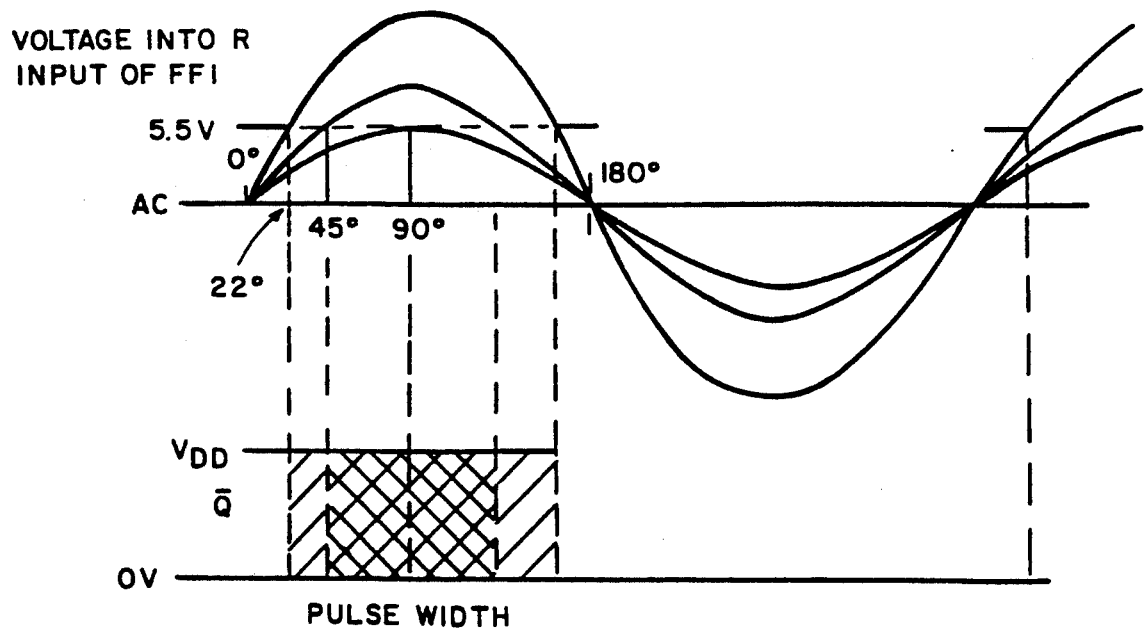

The R input of the flip-flop will be considered high if its voltage is 70% of $V_{DD}$ in the worse case, typically if it is 55% of $V_{DD}$. For 115 VAC input, the peak value at the output of the divider is 14 volts and $V_{DD}$ is 10 volts just prior to the positive peak of the AC input. Thus, when the R input to the flip-flop is 5.5 volts (7 volts worse case), the Q/ output will go high. This corresponds to 0.39 (0.5 worse case) of the peak voltage of 14. Thus, the flip-flop will switch at 22 (30 worse case) degrees into the positive cycle (see FIGS. 1A and 1B). Since the triggering of the SCR 14, as described below, depends upon this timing, the solenoid coil 12 will fire at 22 to 30 degrees into the positive cycle. This effect is considered negligible since less than 5% of the energy is contained in this early portion of the cycle Given that the flip-flop $FF_1$ requires an R input of 5.5 volts (7 volts worse case) to switch Q/ high, the position in the AC cycle where the R input attains the required voltage can be varied by controlling the amplitude of the sine wave input signal to the flip-flop. This is accomplished by varying the setting of the potentiometer $R_5$ in the voltage divider circuit 31 of FIG. 4. FIGS. 1A and 1B illustrate the effect of varying the input sine wave amplitude on the output of Q/.

The phase angle position in the sine wave at which the required R input voltage occurs can be varied from 22 degrees (30 degrees worse case) to 90 degrees by adjusting the voltage divider potentiometer $R_5$. Since the timing of Q/ going high controls the firing of SCR 14, the firing of SCR 14 can be varied from 22 degrees to 90 degrees into the positive half cycle of the AC current. Given practical considerations, the firing point preferably should not exceed 80 degrees.

It will be appreciated that the further into the positive half cycle that the SCR is fired, the less energy is delivered to the solenoid coil 12, thus reducing its power. At 90 degrees, the total energy contained in the sine wave is reduced by 50%.

Given the slow rise and fall times of the signal at the Reset input, the Q/ output waveform may exhibit double switching between set and reset (a "glitch") near the time when the flip-flop sets or resets. Capacitor $C_2$ prevents such "glitches".

The second flip-flop ($FF_2$) is used as a clocked flip-flop in order to set at the beginning (or within 30° of the beginning) of the positive cycle of the AC voltage. $FF_2$, however, will not change state unless switch $S_1$ is closed. With $S_1$ open, the D input of $FF_2$ remains low and the flip-flop will remain set.

When $S_1$ is closed, the D input of $FF_2$ will go high and the next positive edge of the timing signal from $FF_1$ will set $FF_2$. When $FF_2$ is set, the Q output will switch from low to high thereby generating a positive pulse through $C_3$ and triggering the SCR.

Figure 2:
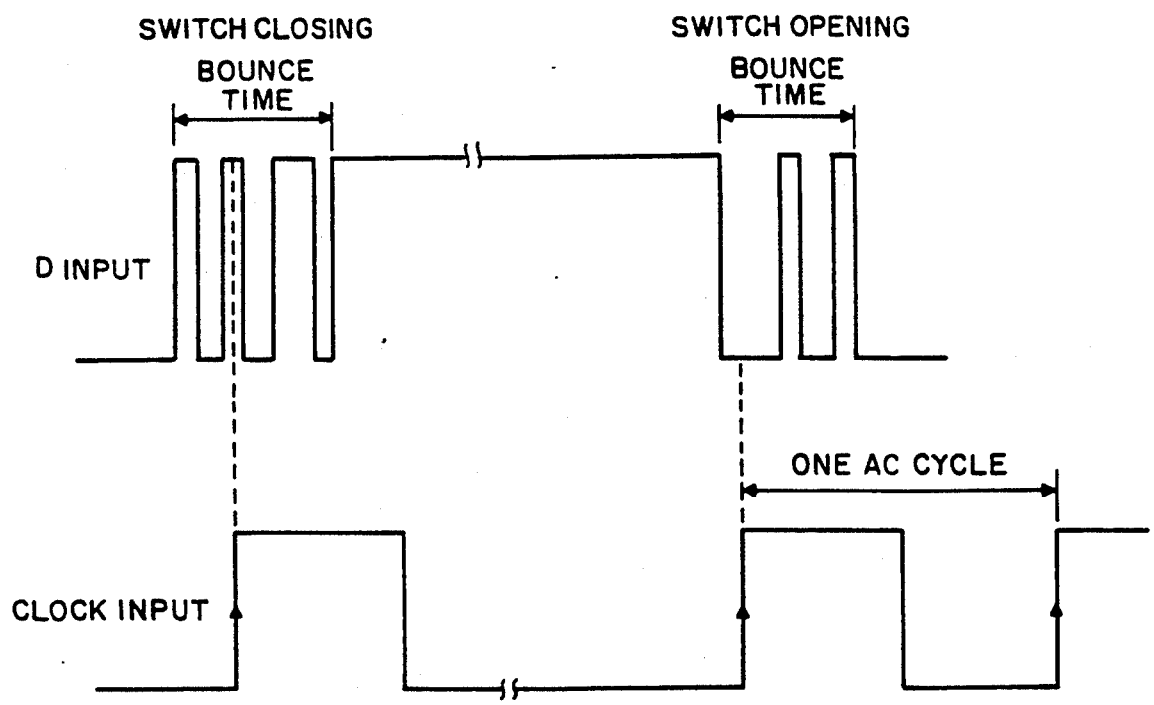
FIG. 2 is a wave form diagram showing the effect of switch bounce.

The closing of switch $S_1$ does not generate a single step function from low to high at the D input because the switch is subject to contact bounce. FIG. 2 shows the waveform at the D of $FF_2$ of FIG. 3 when the effect of switch bounce is considered.

The flip-flop will trigger if the D input happens to be high during the positive transition of the waveform into the Clock input. If the next positive transition of this waveform occurs when the D input is low, the flip-flop will rest. The resetting of $FF_2$ is undesirable because eventually the D input will go high again and there will be two positive transitions into $C_3$ thus causing the SCR to fire on two successive positive cycles of the AC input. In order for this to occur, the contact bounce on the switch must last for at least the duration of one cycle of the AC input. The same analysis applied to the opening of the switch $S_1$ in which case the D input goes from high to low. The circuit thus provides inherent switch bounce rejection equal to one cycle of the AC input (16.6 milliseconds for 60 Hz and 20 milliseconds for 50 Hz).

Capacitor $C_4$ reduces high frequency noise pick-up in the leads to the switch. This noise can cause firing of the circuit when the AC power is applied to the circuit or when AC line transients are present.

The purpose of capacitor $C_5$ is to prevent firing of the SCR due to AC line noise. This noise, which can consist of spikes of voltage of up to 2000 volts in amplitude and rise time of several microseconds, can exceed the dv/dt noise rejection of the SCR. $C_5$ reduces the magnitude of dv/dt across the SCR.

By way of illustration only, the following parts list can be employed in constructing the driver circuit shown in FIGS. 3 and 4.

| SOLENOID DRIVE CIRCUIT PARTS LIST | |
|---|---|
| $R_1$ | Resistor, carbon, 33K ohms, ¼ watt, 5% (115 volts) |
| | Resistor, carbon 68K ohms, 1 watt, 5% (230 volts) |
| $R_2$ | Resistor, carbon, 3.9K ohms, ¼ watt, 5% (230 volts) |
| $R_3$ | Resistor, carbon 33K ohms, ¼ watt, 5% |
| $R_4$ | Resistor, carbon, 1.3K ohms, ¼ watt, 5% |
| $R_5$ | Potentiometer, 2.5K ohms |
| $R_6$ | Resistor, carbon, 100K ohms, ¼ watt, 5% |
| $C_1$ | Capacitor, aluminum electrolytic, radial leads, 2.2 Mfd., +/−20%, 25 volts |
| $C_2, C_4, C_5$ | Capacitor, ceramic disc, .0047 Mfd., +/−20%, 500 volts |
| $C_3$ | Capacitor, ceramic disc, .047 Mfd., +/20%, 25 volts |
| $CR_1$ | Diode, 1N4148 |
| $CR_2$ | Diode, 1N4148 |
| $U_1$ | D-Type Dual Flip-Flop, CMOS, 4013B: |
| | Fairchild F4013BC |
| | Motorola MC1403BCP |
| | National CD4013BC |
| | Panasonic MN4013B |
| | RCA 4013B |
| | Signetics HEF4013BP |
| | SSS SCL4013BE |
| $SCR_1$ | Silicon Controlled Rectifier: |
| | RCA S2800D,E,M (400, 500, 600 $V_{DRM}$) |
| | TAG S1007M |

Having described in detail a preferred embodiment of my invention, it will now be apparent to those skilled in the art that numerous modifications can be made therein without departing from the scope of the invention as defined in the following claims.

What is claimed is:

1. A driver circuit which is responsive to an input AC line voltage for providing a variable power drive signal to a load circuit, said driver circuit comprising:

a) means for receiving the input AC voltage;

b) timing circuit means for producing a variable timing signal that is synchronized to the AC voltage cycle and that can be started at a variable time corresponding to a preselected phase angle in the positive half-cycle of the AC voltage cycle;

c) switch actuated means responsive to said timing signal for generating a control signal for a selected period of time that is related to one cycle of the input AC voltage, said selected time period occurring only during the time that the input AC voltage is in the positive portion of its cycle;

d) means for applying said timing signal to said switch actuated control signal generating means;

e) switch means for actuating said control signal generating mean to produce said control signal; and f) firing means responsive to said control signal for providing a drive signal to the load circuit during the time period that the control signal is applied to the firing means.

2. The driver circuit of claim 1 wherein said timing circuit means and said control signal generation means comprise a single integrated circuit chip.

3. The driver circuit of claim 2 wherein said single integrated circuit chip is flip-flop.

4. The driver circuit of claim 1 wherein said switch means comprises a single pole single throw switch.

5. The driver circuit of claims 1 or 4 wherein only one control signal is produced during a full cycle of the AC voltage even though switch bounce occurs during a portion of the AC voltage cycle.

6. A driver circuit which is responsive to an input AC line voltage for providing a drive signal to a load circuit, said driver circuit comprising:

a) means for receiving the input AC voltage;

b) means for providing a variable AC voltage that is related to the input AC voltage;

c) sine wave shaper means for producing a positive edge variably delayed square wave timing signal in response to said variable voltage with the amount of delay being an inverse function of the amplitude of said variable AC voltage;

d) a switch actuated continually clocked flip-flop means responsive to said timing signal for generating upon the actuation of the flip-flop means a control signal for a selected time period that is related to one cycle of the input AC voltage, said selected time period occurring only during the time that the input AC voltage is in the positive portion of its cycle;

e) means for applying said timing signal to the clock input of said clocked flip-flop means;

f) switch means for actuating said continually clocked flip-flop means; and, g) firing means responsive to said control signal for providing a drive signal to the load circuit during the time period that the control signal is applied to the firing means.

7. The driver circuit of claim 6 wherein the variably delayed positive edge of the square wave timing signal is delayed within the range of 22 degrees to 90 degrees from the positive going zero crossing of the input AC voltage.

8. The driver circuit of claim 6 wherein the variably delayed positive edge of the square wave timing signal is delayed within the range of 22 degrees to 80 degrees from the positive going zero crossing of the input AC voltage.

9. The driver circuit of claim 6 wherein said clocked flip-flop is a D-type flip-flop and wherein actuation of said switch means applies drain voltage to said flip-flop.

10. A driver circuit which is responsive to an input AC line voltage for providing a drive signal to a load circuit, said driver circuit comprising:

a) means for receiving the input AC voltage;

b) timing circuit means for producing a timing signal that is synchronized to an AC voltage cycle in communication with the means for receiving the AC voltage;

c) first switch actuated means responsive to said timing signal for generating a control signal for a selected period of time that is related to one cycle of the input AC voltage, wherein only one control signal is produced during a full cycle of the AC voltage even though switch bounce occurs during a portion of the AC voltage cycle, and said selected time period occurring only during the time that the input AC voltage is in the positive portion of its cycle;

d) means for applying said timing signal to said switch actuated control signal generating means;

e) second switch means for actuating said control signal generating means to produce said control signal; and f) firing means responsive to said control signal for providing a drive signal to the load circuit during the time period that the control signal is applied to the firing means.

11. The driver circuit of claim 1 wherein said timing circuit means and said control signal generation means comprise a single integrated circuit chip.

12. The driver circuit of claim 11 wherein said single integrated circuit chip is flip-flop.

13. The driver circuit of claim 10 wherein said switch means comprises a single pole single throw switch.

14. A driver circuit which is responsive to an input AC line voltage for providing a drive signal to a load circuit, said driver circuit comprising:

a) means for receiving the input AC voltage;

b) means for providing an AC voltage that is related to the input AC voltage;

c) sine wave shaper means for producing a positive edge delayed square wave timing signal in response to DC voltage that is related to the input AC voltage;

d) a switch actuated continually clocked flip-flop means responsive to said timing signal for generating upon the actuation of the flip-flop means a control signal for a selected time period that is related to one cycle of the input AC voltage, said selected time period occurring only during the time that the input A voltage is in the positive portion of its cycle;

e) means for applying said timing signal to a clock input of said clocked flip-flop means;

f) switch means for actuating said continually clocked flip-flop means; and g) firing means responsive to said control signal for providing a drive signal to the load circuit during the time period that the control signal is applied to the firing means.

15. The driver circuit of claim 14 wherein the delayed positive edge of the square wave timing signal is delayed 30 degrees or less from the positive going zero crossing of the input AC voltage.

16. The driver circuit of claim 15 wherein the delayed positive edge of the square wave timing signal is delayed by 22 degrees to 30 degrees from the positive going zero crossing of the input AC voltage.

17. The driver circuit of claim 14 wherein the clocked flip-flop means is clocked no more than 30 degrees after the positive going zero crossing of the input AC voltage.

18. The driver circuit of claim 14 wherein said clocked flip-flop is a D-type flip-flop and wherein actuation of said switch means applies drain voltage to said flip-flop.

19. The driver circuit of claim 14 wherein only one control signal is produced during a full cycle of the AC voltage even though switch bounce of said switch means occurs during a portion of the AC voltage cycle.

* * * * *